(12) United States Patent
McHardy et al.

(10) Patent No.: US 9,030,173 B2
(45) Date of Patent: May 12, 2015

(54) IDENTIFYING AND AMERLIORATING A DETERIORATING CONDITION FOR BATTERY NETWORKS IN-SITU

(75) Inventors: John McHardy, Oxnard, CA (US); Paul Nicholas Chait, San Rafael, CA (US); Kurt Salloux, Woodside, CA (US); Stanley Chait, New York, NY (US)

(73) Assignee: Global Energy Innovations, Inc., Santa Clara, CA (US)

( * ) Notice: Subject to any disclaimer, the term of this patent is extended or adjusted under 35 U.S.C. 154(b) by 639 days.

(21) Appl. No.: 13/316,253

(22) Filed: Dec. 9, 2011

(65) Prior Publication Data

US 2012/0084032 A1    Apr. 5, 2012

Related U.S. Application Data

(63) Continuation-in-part of application No. 12/290,359, filed on Oct. 29, 2008, now Pat. No. 8,169,195, which is a continuation-in-part of application No. 11/489,094, filed on Jul. 18, 2006, now Pat. No. 7,786,702.

(51) Int. Cl.
  *H02J 7/04* (2006.01)
  *G01K 1/00* (2006.01)
  *G01R 31/36* (2006.01)
  *H01M 10/48* (2006.01)
  *H01M 10/12* (2006.01)

(52) U.S. Cl.
  CPC ........ *G01R 31/3679* (2013.01); *G01R 31/3627* (2013.01); *G01R 31/3658* (2013.01); *H01M 10/121* (2013.01); *H01M 10/486* (2013.01)

(58) Field of Classification Search
  CPC ....... H01M 10/486; G01K 3/08; H02J 7/0008

USPC .................. 320/152, 150; 703/130; 374/100; 702/130
See application file for complete search history.

(56) References Cited

U.S. PATENT DOCUMENTS

| | | | |
|---|---|---|---|
| 4,342,963 A * | 8/1982 | Karnowski et al. | 324/431 |
| 5,140,269 A | 8/1992 | Champlin | |
| 5,444,378 A * | 8/1995 | Rogers | 324/428 |
| 5,574,355 A | 11/1996 | Bertness et al. | |
| 5,582,928 A * | 12/1996 | Farley | 429/7 |
| 5,757,192 A | 5/1998 | McShane et al. | |
| 6,023,150 A | 2/2000 | Patino et al. | |
| 6,051,976 A | 4/2000 | Bertness | |
| 6,081,098 A | 6/2000 | Bertness et al. | |
| 6,091,245 A | 7/2000 | Bertness | |
| 6,104,167 A | 8/2000 | Bertness et al. | |
| 6,172,486 B1 * | 1/2001 | Campagnuolo et al. | 320/141 |

(Continued)

FOREIGN PATENT DOCUMENTS

EP    1206826 B1    2/2009
FR    2883103 A1 *    9/2006

OTHER PUBLICATIONS

Stigh, U., Continuum Damage Mechanics and the Life-Fraction Rule, ASME, vol. 73, Jul. 2006, pp. 702-704.

(Continued)

*Primary Examiner* — M'Baye Diao
(74) *Attorney, Agent, or Firm* — Peters Verny, LLP

(57) ABSTRACT

A temperature is measured for each terminal of the battery unit. The magnitude and sign of a temperature differential is calculated from the temperatures. The temperature differential is then correlated to a deteriorating condition of the battery unit.

8 Claims, 7 Drawing Sheets

(56) References Cited

U.S. PATENT DOCUMENTS

| | | | |
|---|---|---|---|
| 6,172,505 B1 | 1/2001 | Bertness | |
| 6,313,608 B1 | 11/2001 | Varghese et al. | |
| 6,323,650 B1 | 11/2001 | Bertness et al. | |
| 6,329,793 B1 | 12/2001 | Bertness et al. | |
| 6,411,098 B1 | 6/2002 | Laletin | |
| 6,466,026 B1 | 10/2002 | Champlin | |
| 6,566,883 B1 | 5/2003 | Vonderhaar et al. | |
| 6,633,165 B2 | 10/2003 | Bertness | |
| 6,707,303 B2 | 3/2004 | Bertness et al. | |
| 6,805,090 B2 | 10/2004 | Bertness et al. | |
| 6,806,716 B2 | 10/2004 | Bertness et al. | |
| 6,832,171 B2 | 12/2004 | Barsoukov et al. | |
| 6,871,151 B2 | 3/2005 | Bertness | |
| 6,885,195 B2 | 4/2005 | Bertness | |
| 6,906,523 B2 | 6/2005 | Bertness et al. | |
| 6,930,485 B2 | 8/2005 | Bertness et al. | |
| 6,990,422 B2 | 1/2006 | Latelin et al. | |
| 7,003,411 B2 | 2/2006 | Bertness | |
| 7,081,755 B2 | 7/2006 | Klang et al. | |
| 7,253,680 B2 | 8/2007 | Latelin | |
| 7,329,389 B2 * | 2/2008 | Horovitz et al. | 422/83 |
| 7,398,176 B2 | 7/2008 | Bertness | |
| 7,446,536 B2 | 11/2008 | Bertness | |
| 7,479,763 B2 | 1/2009 | Bertness | |
| 7,557,586 B1 | 7/2009 | Vonderhaar et al. | |
| 7,595,611 B2 | 9/2009 | Reynier et al. | |
| 7,595,643 B2 | 9/2009 | Klang | |
| 7,598,699 B2 | 10/2009 | Restaino et al. | |
| 7,598,743 B2 | 10/2009 | Bertness | |
| 7,598,744 B2 | 10/2009 | Bertness et al. | |
| 7,656,162 B2 | 2/2010 | Vonderhaar et al. | |
| 7,688,074 B2 | 3/2010 | Cox et al. | |
| 7,705,602 B2 | 4/2010 | Bertness | |
| 7,706,991 B2 | 4/2010 | Bertness et al. | |
| 7,710,119 B2 | 5/2010 | Bertness | |
| 7,723,993 B2 | 5/2010 | Klang | |
| 7,728,597 B2 | 6/2010 | Bertness | |
| 7,772,850 B2 | 8/2010 | Bertness | |
| 7,777,612 B2 | 8/2010 | Sampson et al. | |
| 7,786,702 B1 | 8/2010 | Chait et al. | |
| 7,786,734 B2 | 8/2010 | Andersson | |
| 7,791,348 B2 | 9/2010 | Brown et al. | |
| 7,808,131 B2 | 10/2010 | Hurst et al. | |
| 7,808,375 B2 | 10/2010 | Bertness et al. | |
| 7,924,015 B2 | 4/2011 | Bertness | |
| 7,940,052 B2 | 5/2011 | Vonderhaar et al. | |
| 7,940,053 B2 | 5/2011 | Brown et al. | |
| 7,959,476 B2 | 6/2011 | Smith et al. | |
| 7,977,914 B2 | 7/2011 | Bertness | |
| 7,999,505 B2 | 8/2011 | Bertness | |
| 8,164,343 B2 | 4/2012 | Bertness | |
| 8,190,383 B2 | 5/2012 | Chen et al. | |
| 8,190,384 B2 | 5/2012 | Zhang et al. | |
| 8,192,789 B2 | 6/2012 | Albano et al. | |
| 8,198,759 B2 | 6/2012 | Hurst et al. | |
| 8,198,900 B2 | 6/2012 | Bertness et al. | |
| 8,203,345 B2 | 6/2012 | Bertness | |
| 8,237,407 B2 | 8/2012 | Hurst et al. | |
| 8,237,448 B2 | 8/2012 | Bertness | |
| 8,306,690 B2 | 11/2012 | Bertness et al. | |
| 8,344,685 B2 | 1/2013 | Bertness et al. | |
| 8,357,464 B2 | 1/2013 | Sastry et al. | |
| 8,436,619 B2 | 5/2013 | Bertness et al. | |
| 8,442,877 B2 | 5/2013 | Bertness et al. | |
| 8,471,520 B2 | 6/2013 | Coe et al. | |
| 8,493,022 B2 | 7/2013 | Bertness | |
| D687,727 S | 8/2013 | Kehoe et al. | |
| 8,513,949 B2 | 8/2013 | Bertness | |
| 8,516,429 B2 | 8/2013 | Wu et al. | |
| 2003/0088375 A1 | 5/2003 | Bertness et al. | |
| 2003/0163287 A1 * | 8/2003 | Vock et al. | 702/187 |
| 2004/0145352 A1 * | 7/2004 | Harrison | 320/150 |
| 2007/0252435 A1 | 11/2007 | Coe et al. | |
| 2010/0201320 A1 | 8/2010 | Coe et al. | |
| 2011/0218747 A1 | 9/2011 | Bertness | |
| 2011/0300416 A1 | 12/2011 | Bertness | |
| 2011/0309800 A1 | 12/2011 | Bertness | |
| 2012/0041697 A1 | 2/2012 | Stukenberg | |
| 2012/0041698 A1 | 2/2012 | Zhang et al. | |
| 2012/0079710 A1 | 4/2012 | Bertness | |
| 2013/0087624 A1 | 4/2013 | Bertness et al. | |
| 2013/0158782 A1 | 6/2013 | Bertness et al. | |

OTHER PUBLICATIONS

Christen, Thomas, et al., Energy-power relations of supercaps from impedance spectroscopy data, Dec. 1999, 5 pages.

Tinnemeyer, Jorn, A., 31-4: Diamagnetic Measurements in Lead Acid Batteries to Estimate State of Charge, Journal of Power Sources04312010, 4 pages.

Marahleh, G., et al., Creep-Life Prediction of Service-Exposed Turbine Blades, Materials Science, vol. 42, No. 4, 2006, pp. 476-481.

Huang, Rongwen, Estimation of State-of-Charge of Lead-Acid Batteries Using Electrochemistry Theorem, MSME International Journal, Series C, vol. 49, No. 1, 2006, pp. 265-271.

Rogatchev, T., et al., The Effect of Current Denisty and Thickness of the Active Mass Upon the Corrosion Rate of the Spines of Lead-Acid Battery Plates, Journal of Power Sources, 10 (1983), pp. 291-303.

Papazov, G., et al., Influence of the Lead Dioxide Active Mass on the Corrosion Rate of the Spines of Positive Lead-Acid Battery Plates, Journal of Power Sources, 6 (1981) pp. 15-24.

Kim, Ui Seong, et al., Modeling of the capacity loss of a 12 V automotive lead-acid battery due to ageing and comparison with measurement data, Journal of Power Sources 190 (2009) pp. 184-188.

Christen, Thomas, et al., Theory of Ragone plots, Journal of Power Sources 91 (2000), pp. 210-216.

Ruetschi, Paul, Aging mechanisms and service life of lead-acid batteries, Journal of Power Sources 127 (2004) pp. 33-44.

Robinson, R. S., System noise as a signal source for impedance measurements on batteries connected to operating equipment, Journal of Power Sources, 42 (1993), pp. 381-388.

Sunu, Won G., et al., Mathematical Model for Design of Battery Electrodes, J. Electrochem. Soc.: Electrochemical Science and Technology, Apr. 1982, pp. 688-695.

Morimoto, Y., et al., Computer Simulation of the Discharge Reaction in Lead-Acid Batteries, I-BIEM, vol. 135, No. 2, J. Electrochem. Soc: Electrochemical Science and Technology, Feb. 1988, pp. 293-298.

Gieraci, James, et al., Using the Cell Broadband Engine to Compute an Electrochemical Battery Model, Massachusetts Institute of Technology, pp. 1-6.

Maia, G., et al., A modelling approach to the optimization of lead-acid battery electrodes, Journal of Applied Electrochemistry 23 (1993), pp. 1151-1161.

Vaaler, L. E., et al., Computerized design and evaluation of improved electrodes for lead-acid batteries, Journal of Applied Electrochemistry 12 (1982), pp. 721-734.

Grube, Ryan J., Automotive Battery State-of-Health Monitoring Methods, Wright State University, 2008, pp. 1-116.

Fasih, Ahmed, Modeling and Fault Diagnosis of Automotive Lead-Acid Batteries, Apr. 2, 2006, pp. 1-94.

Stigh, U., Continuum Damage Mechanics and the Life-Fraction Rule, ASME Journal of Applied Mechanics, Sep. 2005, pp. 1-10.

Invention Disclosure, Instrument for detection of positive grid and/or current collector bus bar corrosion, Sep. 15, 2007, pp. 1-3.

Invention Disclosure, Addendum to disclosure p. 88, Temperature monitoring, Aug. 29, 2007, 1 page.

Invention Disclosure, Europa Meeting, Aug. 13, 2007, pp. 1-5.

Hindin, Barry S., Silver Corrosion Rates Measured by Resistivity Techniques in Flowing Mixed Gas Environments, 2005 Tri-Service Corrosion Conference, pp. 1-11.

U.S. Appl. No. 12/963,500 Non-Final Office Action issued Feb. 5, 2013 (29 pages).

U.S. Appl. No. 12/963,500 Applicant's Response to the Non-Final Office Action, submitted Jul. 5, 2013.

Langan, Peter E., "The Art of Impedance Testing," 0-7803-5523-7 IEEE, 1999, pp. 121-128.

* cited by examiner

IDENTIFYING AND AMERLIORATING A DETERIORATING CONDITION FOR BATTERY NETWORKS IN-SITU

CROSS-REFERENCE TO RELATED APPLICATIONS

This application claims the benefit of priority under 35 U.S.C. 120 as a continuation-in-part of U.S. application Ser. No. 12/290,359, entitled METHOD AND APPARATUS FOR USING A BATTERY TERMINAL TEMPERATURE DIFFERENTIAL DURING CHARGING OF THE BATTERY, by Stanley Chait et al., which is a continuation-in-part of U.S. Pat. No. 7,786,702, entitled BATTERY CONDITIONER AND CHARGER, by Stanley Chait et al., both of which are hereby incorporated by reference in their entirety.

FIELD OF THE INVENTION

The present invention relates generally, to testing electronic components, and more specifically, to identifying a deteriorating condition for a battery in an electrical circuit.

BACKGROUND OF THE INVENTION

A network of batteries can be used to provide power source redundancy for critical consumer and commercial applications. The battery network includes several batteries connected together in series, parallel, or other combinations. The applications can be active or passive. In one example, an active battery network powers a consumer's electric automobile. In another example, a passive battery network provides redundancy and failover protection for a commercial server system using electricity wired from a power grid as a primary power source.

Battery performance can degenerate or become unreliable in response to the presence of manufacturing defects or the development of conditions such as grid corrosion, sulfation, or loss of water. Accordingly, maintenance of battery networks is important to ensure reliable performance. But testing a battery for performance characteristics such as cold cranking amps, state of charge, and the like, require that it be removed from use. Alternatively, a battery network can be deactivated and tested as a whole.

Furthermore, state of the art battery testing techniques are unable to identify a specific reason that a battery is failing, or has failed. Consequentially, an operator does not have the opportunity to ameliorate or at least slow down the impending failure. Some types of batteries, such as valve-regulated lead acid (VRLA) batteries, have a higher failure rate and have more catastrophic failures, so the lack of information about the battery condition is especially debilitating.

Therefore, what is needed is a technique for testing battery networks that can be applied while the batteries are in operation to identify and potentially ameliorate a deteriorating condition for a battery.

SUMMARY OF THE INVENTION

A method, system and computer program product for identifying a deteriorating condition in a battery unit based on a temperature differential between terminals.

In one embodiment, a temperature is measured for each terminal of the battery unit (e.g., positive and negative terminals). The magnitude and sign of a temperature differential is calculated from the temperatures. The temperature differential is then correlated to a deteriorating condition of the battery unit. The battery unit can be a single-cell battery, part of a multi-cell battery, or part of a network of batteries. In one example, the battery unit is part of a back-up power system.

In some embodiments, an ameliorating action is automatically taken to contain, reverse, or retard the battery deterioration. Furthermore, the battery unit, or at least the remaining battery network, can remain in service during the action.

In another embodiment, the temperature differential is determined during a low current operation, and is confirmed at a higher current operation. Further, the temperature differential can be combined with impedance characteristics in determining the condition.

Advantageously, the battery life can be automatically extended by containing, reversing, or retarding deteriorating conditions.

BRIEF DESCRIPTION OF THE DRAWINGS

In the following drawings like reference numbers are used to refer to like elements. Although the following figures depict various examples of the invention, the invention is not limited to the examples depicted in the figures.

DETAILED DESCRIPTION OF THE INVENTION

A system, method and computer program product for identifying a deteriorating battery condition is disclosed. In one embodiment, a temperature differential between terminals is correlated to a specific deteriorating battery condition, such as grid corrosion or thermal runaway. In response to determining the conditions, an ameliorating action can be taken to contain, prevent, reverse, or retard the specific deteriorating battery condition.

Figure 1:
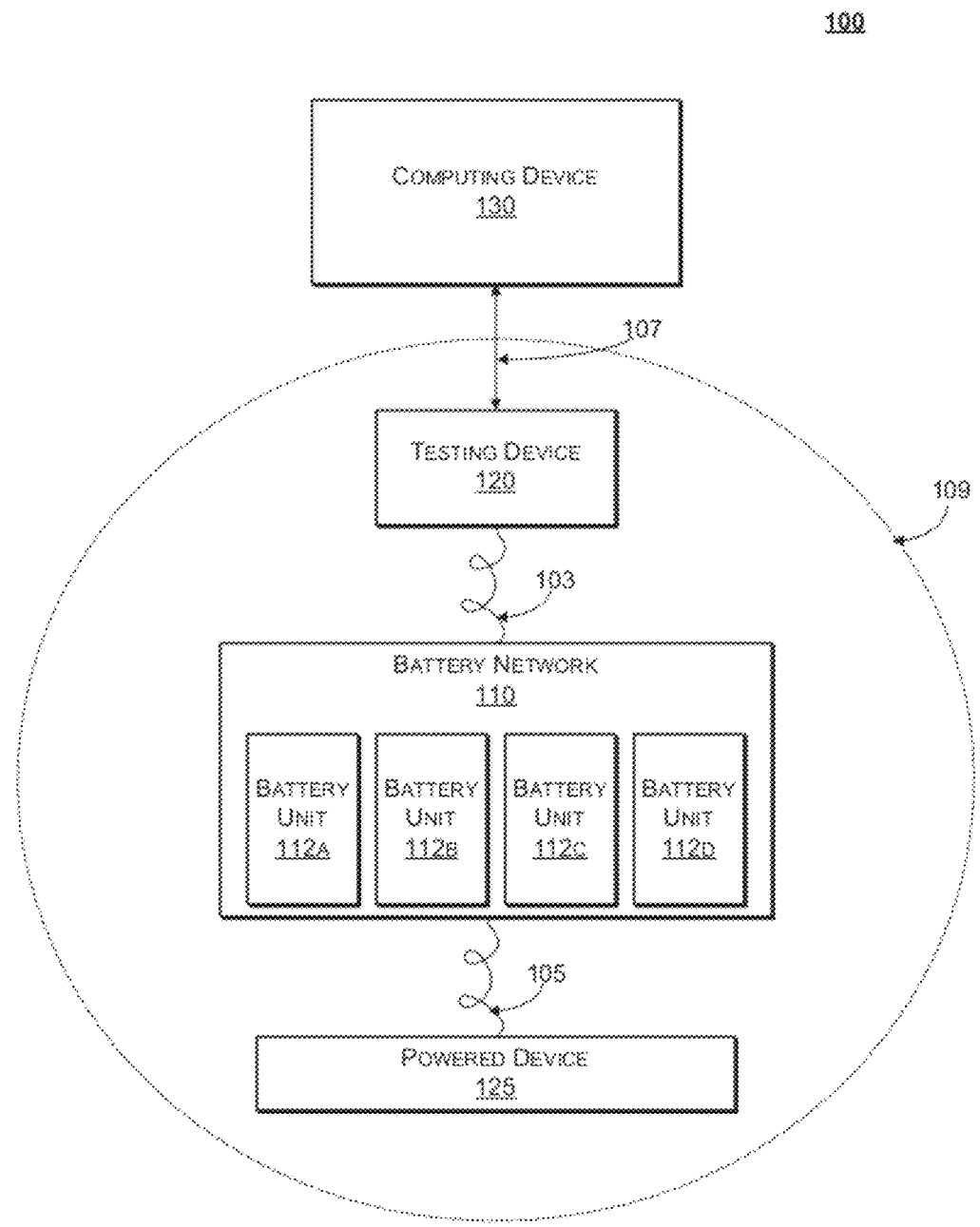
FIG. 1 is a block diagram illustrating a system to identify a deteriorating condition in a battery unit based on a temperature differential between terminals, according to an embodiment of the present invention.

FIG. 1 is a block diagram illustrating a system 100 to monitor battery condition, according to one embodiment of the present invention. It will be understood that the embodiment of FIG. 1 is merely exemplary and can have alternative configurations and more or less components within the spirit of the present invention.

The system 100 generally comprises a battery network 110, a testing device 120, a computing device 130, and a powered device 125. The battery network 110 is wired to nodes of the testing device 120 during testing at a site 109 via line 103. Further, the testing device 120 is connected to the computing device 130 during data transfer via channel 107 (e.g., a serial or parallel data cord, wired or wireless Ethernet channel, USB cord, FireWire cord, or the like). Lastly, powered device 125 is connected to the battery network 110 to receive AC or DC power via electrical cable 105.

The battery network 110 includes one or more individual battery units 112a-d. In one embodiment, the battery units 112a-d utilize lead acid chemistry, however, other battery chemistries can equally be used.

The battery units 112a-d can be of any size or capacity used for residential or commercial use. The battery units 112a-d are preferably rechargeable secondary batteries, but primary batteries are not excluded. The battery units 112a-d can be of any battery chemistry. A connection topology of the battery network 110 refers to a circuit configuration defining a flow of current between the main positive and negative terminals of the battery network 110. For example, the battery network 110 can be connected in series, in parallel, or any combination of the two.

In one application, the battery network 110 can be in active use to power a mobile system, such as an electric-powered automobile. In another application, the battery network 110 can be in reserve use as backup power for a telecommunications system. Preferably VLA or VRLA-type batteries are implemented. Typically, VRLA-type batteries have higher failure rates and failures can be more catastrophic, making the identification of deteriorating battery conditions even more critical.

The testing device 120 can be, for example, a handheld device configured with hardware and firmware specific to battery testing, such as the EC1000 produced by Global Energy Innovations of Santa Clara, Calif. In one embodiment, the testing device 120 uses line 103 for measuring temperatures. Line 103 can include multiplexed lines for connecting to any number of terminals for various battery cells.

Additionally, the testing device 120 can generate and input an excitation or perturbation signal (or signals) of a known frequency (or frequencies), and known current amplitude and phase over line 103. In this case, line 103 can include, for example, a 4-conductor electrical cable, separate from the temperature probes. The perturbation signal is applied to each of the battery units 112a-d in turn. The amplitude and phase shift of the voltage responses of the batteries to the excitation signals at the various frequencies are measured, and used to derive impedance values for the battery. In other embodiments, the excitation signal can be a square wave or a triangle wave, or a voltage or a current step, and the testing device 120 derives impedance values for the battery from the battery's response to those excitation signals. In one implementation, the testing device 120 is also able to measure voltage, specific gravity, and other characteristics of the battery network 110.

In making the temperature measurements, appropriate precautions are taken to avoid artifacts such as ohmic heating at resistive contacts between the current connectors and the battery terminals. The precautions may include cleaning and abrasion of the contact surfaces, the use of clamps to apply pressure between connectors and terminals, and monitoring the voltage between each connector and terminal to confirm the absence of appreciable ohmic voltage drops.

The computing device 130 can be a personal computer, a server blade, a laptop computer, a single-board computer, or any other type of processor-controlled device. In one implementation, the testing device 120 is used on site 109 for immediate, basic testing results while the computing device 130, having more processing power, a larger display and a more complete keyboard, can be used off site for further analysis. Data can be uploaded in batch mode after collection from the sites, or in real time through a wireless network connection.

The powered device 125 can be any device drawing power for operation from the battery network 110. For example, the powered device 125 can be an electrical automobile, a personal computer or a network server, a section of a railroad system, a bank security system, a commercial property, or the like.

Figure 2:
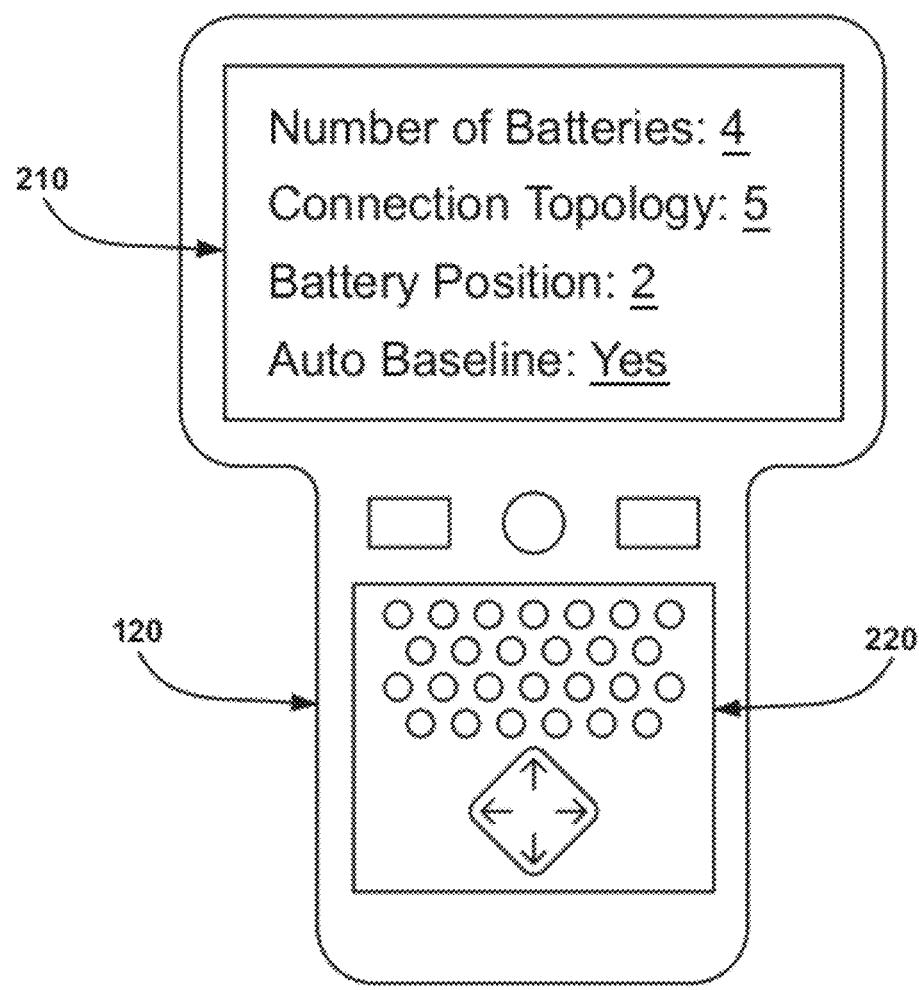
FIG. 2 is a schematic diagram illustrating a testing device, according to an embodiment of the present invention.

FIG. 2 is a schematic diagram illustrating an exemplary testing device 200 (such as the testing device 120), according to an embodiment of the present invention. The testing device 120 is a handheld device and includes a display screen 210 and a keypad 220. The testing device 120 can be enclosed in a casing made of suitable materials, such as durable plastic with a rubber grip for rugged environments. It is understood that testing device 120 is merely an example which can be varied while remaining within the spirit of the present invention.

In one implementation, a service person carries the testing device 200 from one site to another to be used in troubleshooting or maintenance of installations. In another implementation, the testing device 200 is deployed in a laboratory environment in which operating conditions are simulated. In another alternative embodiment, the testing device 200 is permanently installed for continuous monitoring of a battery network.

Figure 3:
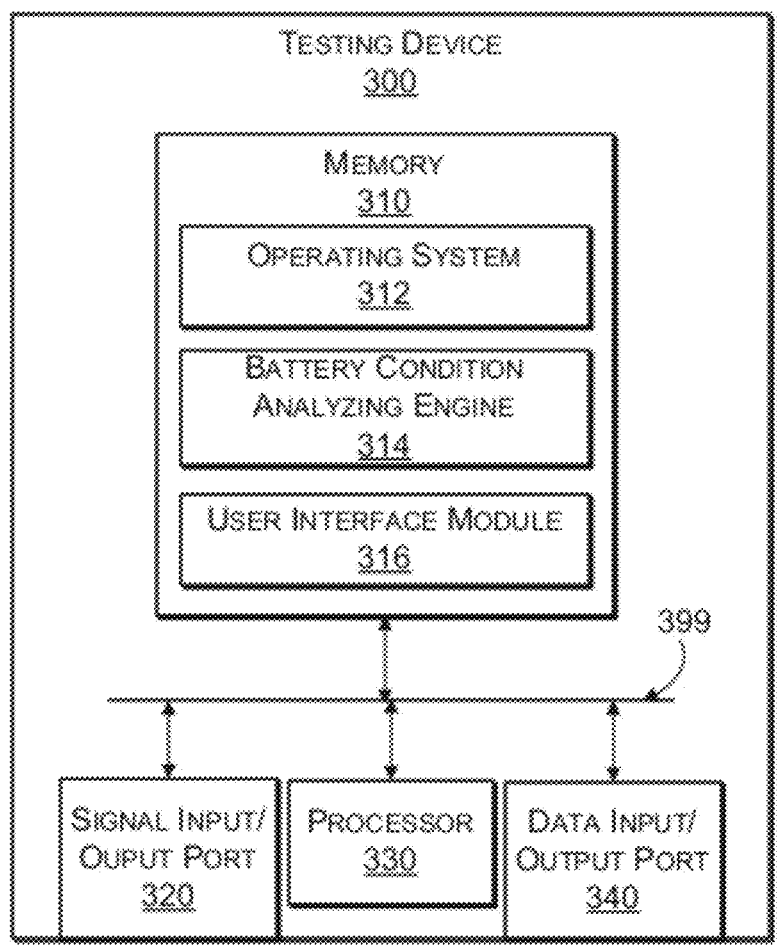
FIG. 3 is a block diagram illustrating a testing device, according to an embodiment of the present invention.

FIG. 3 is a block diagram showing exemplary components internal to a testing device 300 (such as testing device 120). A data input/output port 340 can be connected to external data sources, such as computing device 130 of FIG. 1. Also, a signal input/output port 320 can be connected to, for example, a battery unit for testing. The input/output port 320 can be connected to a temperature measuring device and/or an impedance measuring device (neither shown in FIG. 3). Signals can be digital or analog.

A battery condition analyzing engine 314 is comprised of hardware, software, or a combination of both. In operation, the battery condition analyzing engine 314 identifies a deteriorating condition in a battery unit. The battery condition analyzing engine 314 receives data such as a temperature of each terminal of at least one battery cell. Additionally, the battery condition analyzing engine 314 can receive impedance data or just raw data from a response signal that was received. A temperature differential and/or an impedance response can be mapped to a specific deteriorating condition.

The battery condition analyzing engine 314 can include a temperature module to calculate a temperature differential between a positive terminal and a negative terminal of a battery unit. The temperature can be measured in any scale such as Celsius, Fahrenheit, or Kelvin. In one embodiment, the temperature module further comprises a thermocouple for environments that are highly sensitive to accurate readings. In another embodiment, the temperature module further comprises an infrared thermometer for a wireless reading of the temperature, such as by a hand held unit. The readings can be analog, digital, or converted between analog and digital values.

A signal input/output port 320 is coupled to the battery network 110 of FIG. 1 to send a perturbation signal and receive a response signal. In an embodiment, the response signal is measured to identify changes in impedance characteristics of an individual battery unit. In another embodiment, the impedance characteristics include a real component, an imaginary component, and optionally, a phase shift. These additional characteristics provide additional data points for identifying a mode of failure as discussed in more detail below.

An operating system 312 can be a mobile operating system, such as is used for a tablet computer or a smart cell phone, or standard PC operating system such as Windows or Unix. Alternatively, the operating system 312 can be customized for the testing device 300.

A user interface module 316 can be connected to an output screen, a touch screen, a QWERTY keyboard, or the like. The user interface module 316 manages the display and can receive input from the user.

The memory 310 can be RAM, FLASH, volatile, non-volatile or any other suitable type of memory device. The processor 330 can be a RISC, FPGA, ASIC, a CPU or mobile processor by Intel Corporation, or any other suitable type of processor device. The processor 330 can be a single core or multi core processor. Source code for the operating system 312, battery condition analyzing engine 314 and the user interface module 316 can be stored in the memory 310 and executed by the processor 330.

Figure 4:
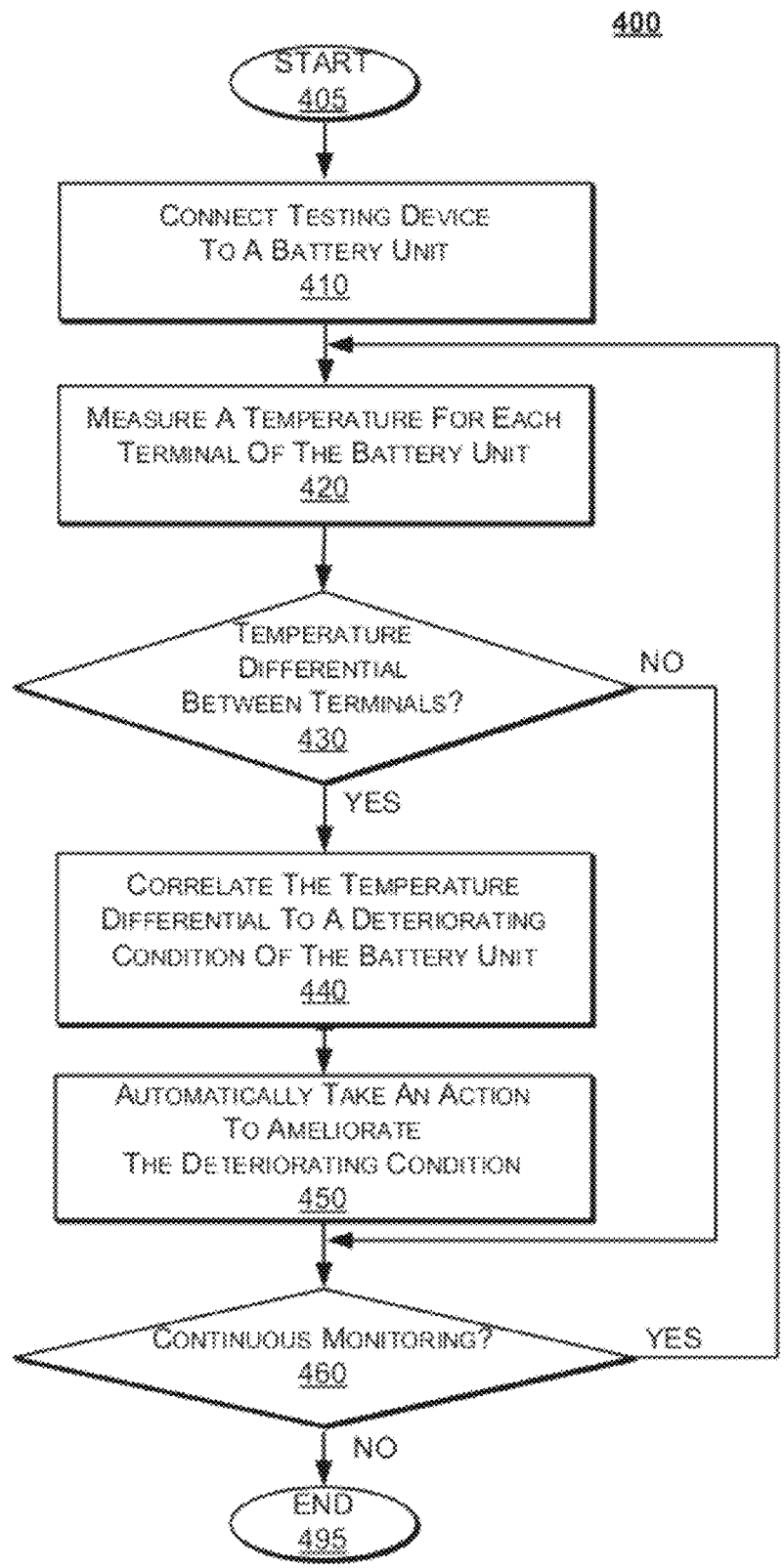
FIG. 4 is a flow diagram illustrating a method for identifying a deteriorating condition in a battery unit based on a temperature differential between terminals, according to an embodiment of the present invention.

FIG. 4 is a flow diagram illustrating a method 400 for identifying a deteriorating battery condition, according to an embodiment of the present invention. The method 400 can be implemented, for example, in the system 100 of FIG. 1.

At step 410, a temperature for each terminal of a battery unit is measured. The temperature measurement can be an isolated process, or one or a set of tests. When hard-wired, a probe is connected to each terminal of a battery unit. In a wireless environment, a probe is placed within the appropriate proximity of the terminal line-of-sight.

At step 420, a magnitude and a sign of the temperature differential are calculated. These parameters are an external input for the remaining process which occurs internally. Further, the parameters can be determined by a single discrete measurement, by an average measurement over a discrete time period, or by continuous monitoring.

Figure 6A:
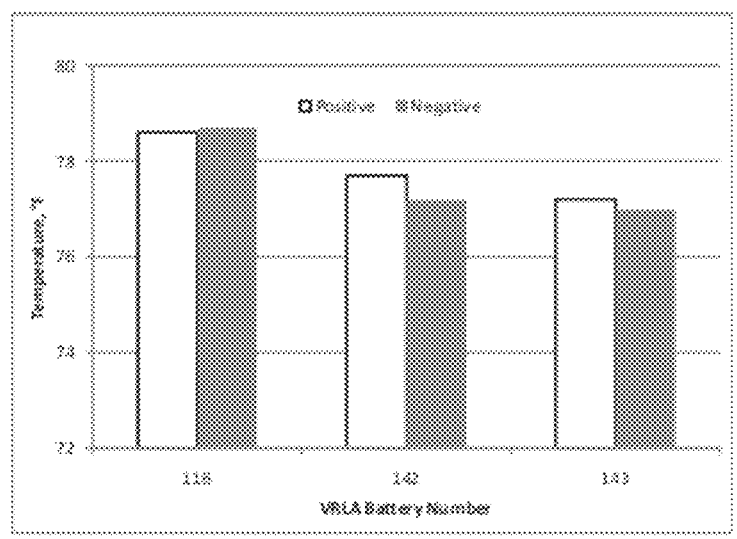
FIGS. 6A-B are graphs illustrating a comparison of terminal temperatures and differential temperatures measured during float charging of 2-volt VRLA batteries, according to one embodiment of the present invention.
Figure 6B:
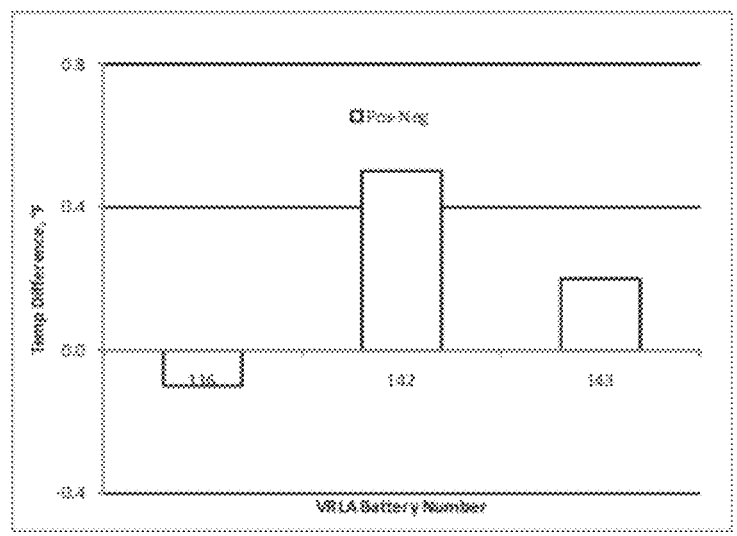
Figure 7A:
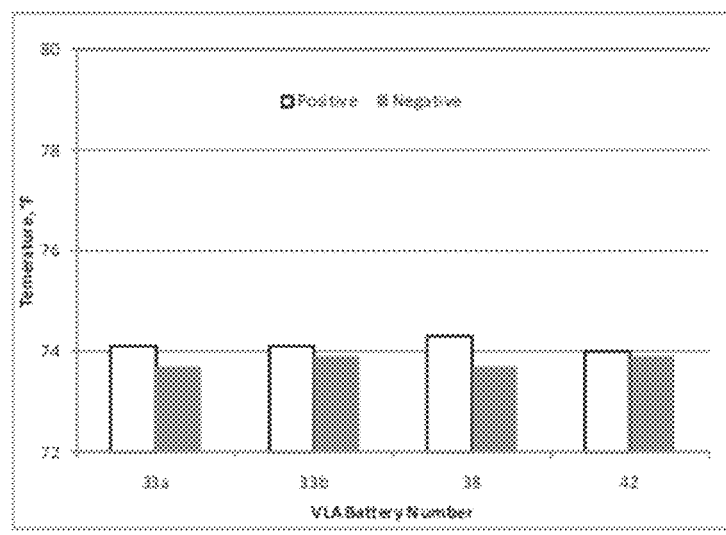
FIGS. 7A-B are graphs illustrating a comparison of terminal temperatures and differential temperatures measured during float charging of 6-volt vented lead acid (VLA) batteries, according to one embodiment of the present invention
Figure 7B:
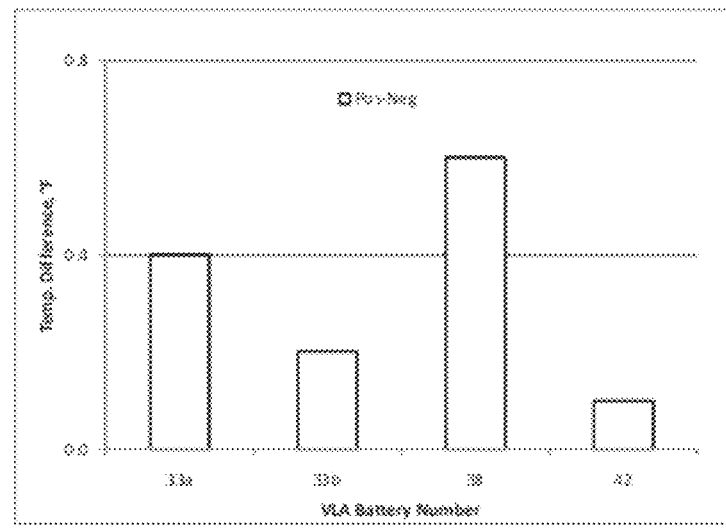

Turning to FIGS. 6A and 7A, terminal temperatures of 2-volt VRLA and 6-VLA batteries are compared during float charging. Next, in FIGS. 6B and 7B, the temperature differentials derived from the terminal differences of FIGS. 6A and 7A are shown.

At step 430, a temperature differential leads to further analysis while a lack of temperature differential can end the process or lead to continued monitoring. The temperature differential can be triggered by a minimum threshold difference between terminals at any time. In other embodiments, the difference must be held over a period of time. The difference can be measured in absolute temperatures, average temperatures, rates of change, or by any other design-specific algorithm.

At step 440, the temperature differential is correlated to a deteriorating condition. The manner in which characteristics of the battery unit are correlated to one or more deteriorating conditions is implementation-specific. In one example, an excessively hot negative terminal can be indicative of thermal runaway. The diagnosis can be made over time using several measurements of temperature differential. Initially, thermal runaway can be cause a temperature differential of just a few degrees Celsius. But ultimately, a rate of growth in the temperature differential increases quickly. In another example, a moderately hot positive terminal can indicate grid corrosion, for example, at a temperature differential at about 10 degrees Celsius.

Optionally, at step 450, an action is taken in response to identification of the deteriorating condition. For example, a system operator can be notified. A detailed response can be automatically generated based on the deteriorating condition. In another example, an automated amelioration process can be initiated, such as desulfation, cooling, charging, or discharging.

Figure 5:
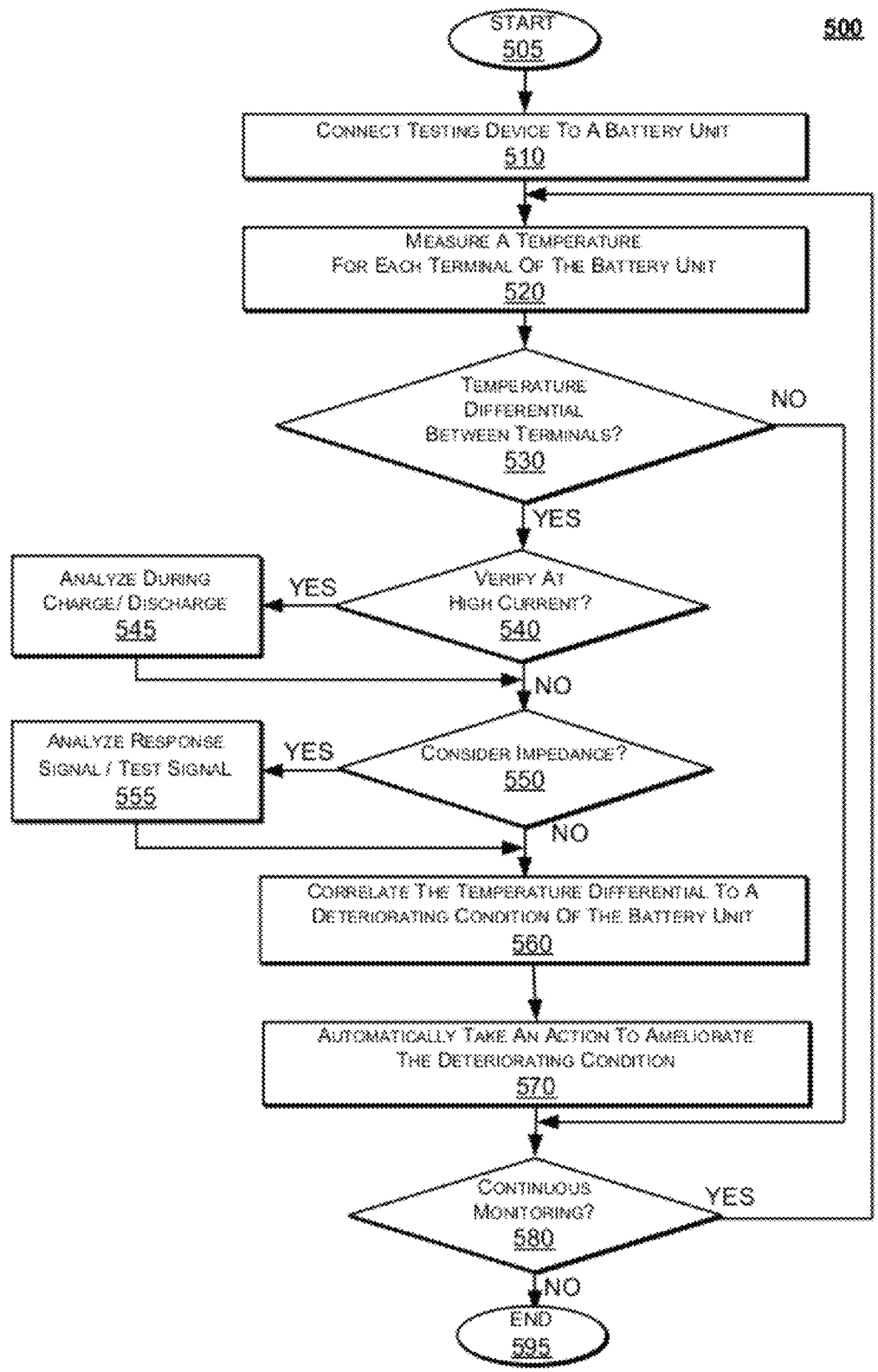
FIG. 5 is a flow diagram illustrating a method for identifying a deteriorating condition in a battery unit based on a temperature differential between terminals, according to another embodiment of the present invention.

FIG. 5 is a flow diagram illustrating a method 500 for identifying a deteriorating battery condition, according to another embodiment of the present invention.

Steps 510, 520 and 530 can be the similar to steps 410, 420 and 430 of FIG. 4, respectively.

At step 540, a temperature differential can be verified at a high current. As discussed, the float current is a relatively low current designed to keep a back-up battery system ready for activation without wasting energy. But the lower current produces less temperature variance between terminals.

At step 545, once a battery unit is suspected of deterioration, a higher current operation such as charging or discharging can be initiated. The higher current can exacerbate the temperature differential, allowing a more accurate identification of the condition. In some embodiments, steps 540 and 545 are excluded from the method 500.

At step 550, impedance can be considered as a factor for identifying the deteriorating battery condition. An excitation signal can be applied to the battery unit by the testing device. The excitation signal has a certain amplitude and phase.

At step 555, the impedance can be determined by comparing a response signal to the excitations signal for changes in amplitude and/or phase. In one embodiment, a deteriorating condition is determined from the impedance characteristics as a verification of a deteriorating condition determined from the temperature differential. In another embodiment, the impedance results are considered in combination with the temperature differential. Various weightings can be given to the results according to particular implementations. In some embodiments, steps 550 and 555 are excluded from the method 500.

Steps 560 and 570 can be similar to steps 440 and 450 of FIG. 4, respectively.

At step 580, if the battery unit is under continuous monitoring, the process continues. In one embodiment, continuous monitoring allows real-time diagnosis of changes in battery conditions. Furthermore, a robust history of each battery units allows anomalies to be put into perspective (e.g., rate of deterioration).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention in which all terms are meant in their broadest, reasonable sense unless otherwise indicated. Any headings utilized within the description are for convenience only and have no legal or limiting effect.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A battery testing device to determine conditions in a battery unit in-situ based on a temperature differential between terminals, comprising:
   a temperature measuring device, coupled to each terminal of the battery unit, to measure a temperature of each terminal; and
   an analyzing engine to calculate a magnitude and a sign of a temperature differential between the terminals of the battery unit, and to correlate the temperature differential to a deteriorating condition of the battery unit,
   wherein the temperature measuring device comprises at least one of an infrared device and a thermocouple.

2. The battery testing device of claim 1, wherein the temperature measuring device measures the temperature differential during float charging at a low current.

3. The battery testing device of claim 1, wherein the deteriorating condition comprises at least one of grid corrosion and thermal runaway.

4. The battery testing device of claim 1, further comprising an impedance measuring device to measure the impedance characteristics, wherein the analyzing engine correlates a combination of the temperature differential and impedance characteristics to the deteriorating condition of the battery unit.

5. A battery testing device to determine conditions in a battery unit in-situ based on a temperature differential between terminals, comprising:
   a temperature measuring device, coupled to each terminal of the battery unit, to measure a temperature of each terminal;
   an analyzing engine to calculate a magnitude and a sign of a temperature differential between the terminals of the battery unit, and to correlate the temperature differential to a deteriorating condition of the battery unit; and
   an impedance measuring device to measure the impedance characteristics, wherein the analyzing engine correlates a combination of the temperature differential and impedance characteristics to the deteriorating condition of the battery unit.

6. The battery testing device of claim 5, wherein the temperature measuring device comprises at least one of an infrared device and a thermocouple.

7. The battery testing device of claim 5, wherein the temperature measuring device measures the temperature differential during float charging at a low current.

8. The battery testing device of claim 5, wherein the deteriorating condition comprises at least one of grid corrosion and thermal runaway.

* * * * *